United States Patent
Lee et al.

(10) Patent No.: US 6,944,085 B2
(45) Date of Patent: Sep. 13, 2005

(54) SEMICONDUCTOR MEMORY DEVICE WITH REDUCED CHIP AREA AND IMPROVED REDUNDANCY EFFICENCY

(75) Inventors: Byeong-Hoon Lee, Seoul (KR); Seung-Keun Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 10/376,757

(22) Filed: Feb. 27, 2003

(65) Prior Publication Data

US 2003/0202417 A1 Oct. 30, 2003

(30) Foreign Application Priority Data

Apr. 30, 2002 (KR) ......................................... 2002-23656

(51) Int. Cl.[7] ................................................. G11C 8/00
(52) U.S. Cl. .................... 365/230.03; 365/200; 365/203
(58) Field of Search ........................... 365/230.03, 200, 365/203

(56) References Cited

U.S. PATENT DOCUMENTS 5,596,536 A * 1/1997 Koh ........................... 365/200
6,154,389 A * 11/2000 Chung et al. ............ 365/185.09

* cited by examiner

Primary Examiner—Van Thu Nguyen
Assistant Examiner—Pho M. Luu
(74) Attorney, Agent, or Firm—Marger Johnson & McCollom, P.C.

(57) ABSTRACT

A redundancy circuit embedded in the semiconductor memory device includes a sector selector and a bit line selector. The bit line selector repairs defective bit lines and the sector selector repairs defective global bit lines and selectively repairs defective bit lines. The sector selector includes a fixed address cell storage box for storing addresses of the defective bit lines and a flexible address cell storage box for storing addresses of the defective global bit lines. The circuit area is minimized since the coding unit corresponding to a sector address is not included in the bit line selector. The repair rate of defective bit lines is improved since the sector selector operates selectively as the bit line selector.

17 Claims, 6 Drawing Sheets

SEMICONDUCTOR MEMORY DEVICE WITH REDUCED CHIP AREA AND IMPROVED REDUNDANCY EFFICENCY

CROSS REFERENCE TO RELATED APPLICATIONS

This application claims priority to Korean Patent Application 2002-23656, filed on Apr. 30, 2002, the contents of which are hereby incorporated by reference in their entirety.

BACKGROUND OF THE INVENTION

1. Field of the Invention

The present invention relates to a semiconductor memory device, and more particularly, to a semiconductor memory device having a redundancy circuit to reduce the chip area and to improve the redundancy efficiency.

2. Description of the Related Art

As the goals of achieving higher integration and larger capacity for semiconductor memory devices are reached, the size of a memory chip becomes increasingly larger. This increase in the size of the memory chip results in a lower wafer yield. Redundancy technology to repair defective memory cells has been used in semiconductor memory devices as one of the ways to increase the wafer yield. Redundancy technology provides a semiconductor memory device with redundant memory cells so that defective memory cells are replaced with corresponding, non-defective, redundant memory cells.

FIG. 1 illustrates a memory array block of a general semiconductor memory device. The semiconductor memory device 10 includes a plurality of sectors 100 and 200. The sectors 100 and 200 each include a plurality of memory blocks 110, 120, 130, 210, 220 and 230 each having a plurality of memory cells, a global column decoder 102 and 202, a sense amplifier 104 and 204, and a write driver 106 and 206. Each of the memory blocks 110, 120, 130, 210, 220 and 230 includes a row decoder 112, 122, 132, 212, 222 and 232 for driving word lines of the memory cells, and a column decoder 114, 124, 134, 214, 224 and 234 for selecting bit lines BL0, BL1, ..., BLk of the memory cells. The bit lines selected from each of the memory blocks 110, 120, 130, 210, 220 and 230 are connected to global bit lines GBL00, GBL01, ..., GBLJ0, GBLJ1. A global column decoder 102 selects one of the global bit lines GBL00, GBL01, ..., GBLJ0, GBLJ1, ... and connects the selected global bit line to the sense amplifier 104 and 204 and the write driver 106 and 206. Each of the memory blocks 110, 120, 130, 210, 220 and 230 has a corresponding redundancy memory block 116, 126, 136, 216, 226 and 236, respectively, consisting of a plurality of redundant memory cells. The redundancy memory cells are substituted for the defective cells in the memory blocks. In addition to the defective cells, the substitution of the redundant memory cells for the defective cells is also applicable to defective bit lines in case that the bit lines BL0, BL1, of the memory blocks 110, 120, 130, 210, 220 and 230 are shorted or opened.

Addresses of the defective cells and the defective bit lines are stored in a fuse box of the memory device 10. If addresses are inputted to select the defective cells or the defective bit lines, the row decoder 112, 122, 132, 212, 222 and 232 and the column decoder 114, 124, 134, 214, 224 and 234 are cut and corresponding redundant memory cells are selected according to the addresses programmed in the fuse box. The fuse box has as many fuses as the number of the addresses for addressing the memory cells of the memory blocks 110, 120, 130, 210, 220 and 230.

The semiconductor memory device 10 can be defective not only if the memory cells or the bit lines BL are defective but also if the global bit lines GBL00, GBL01, ..., GBLJ0, GBLJ1, ... are shorted or opened. If the above-described conventional method for repairing the defective cells or the defective bit lines is used to repair the defective global bit lines, the fuse box should include the fuses corresponding to the addresses required to address the sectors 100 and 200. Therefore, the semiconductor memory device requires a redundancy circuit that has fuses corresponding to each of the memory block addresses and the sector addresses, that is, memory block address fuses and sector address fuses. Accordingly, the redundancy circuit occupies a larger area.

However, in the case where only the defective memory cells or the defective bit lines should be repaired, the sector address fuses of the redundancy circuit are not used. This implies that the redundancy efficiency is low with respect to the area of the redundancy circuit. Additionally, the redundancy circuit occupies a larger area than necessary.

SUMMARY OF THE INVENTION

Accordingly, the present invention is directed to a semiconductor memory device that obviates one or more problems due to limitations and disadvantages of the related art. Embodiments of the invention provide a semiconductor memory device having a redundancy circuit that minimizes the circuit area while improving the redundancy efficiency.

It is to be understood that the following detailed description of embodiments of the invention is not limiting but exemplary and intended to provide further explanation of the invention as claimed. The objectives and other advantages of the invention may be realized and attained by the embodiments particularly pointed out in the written description, illustrated in the appended drawings, or defined by the claims. Additional advantages, objects, and features of the invention will be apparent upon examination of the following material or after practice of the invention.

DETAILED DESCRIPTION OF THE INVENTION

Reference will now be made in detail to preferred embodiments of the invention, examples of which are illustrated in the accompanying drawings. Specifically, a nonvolatile memory device having EPROM memory cells will be disclosed. However, the invention is not limited to nonvolatile memory devices having EPROM memory cells.

Figure 2:
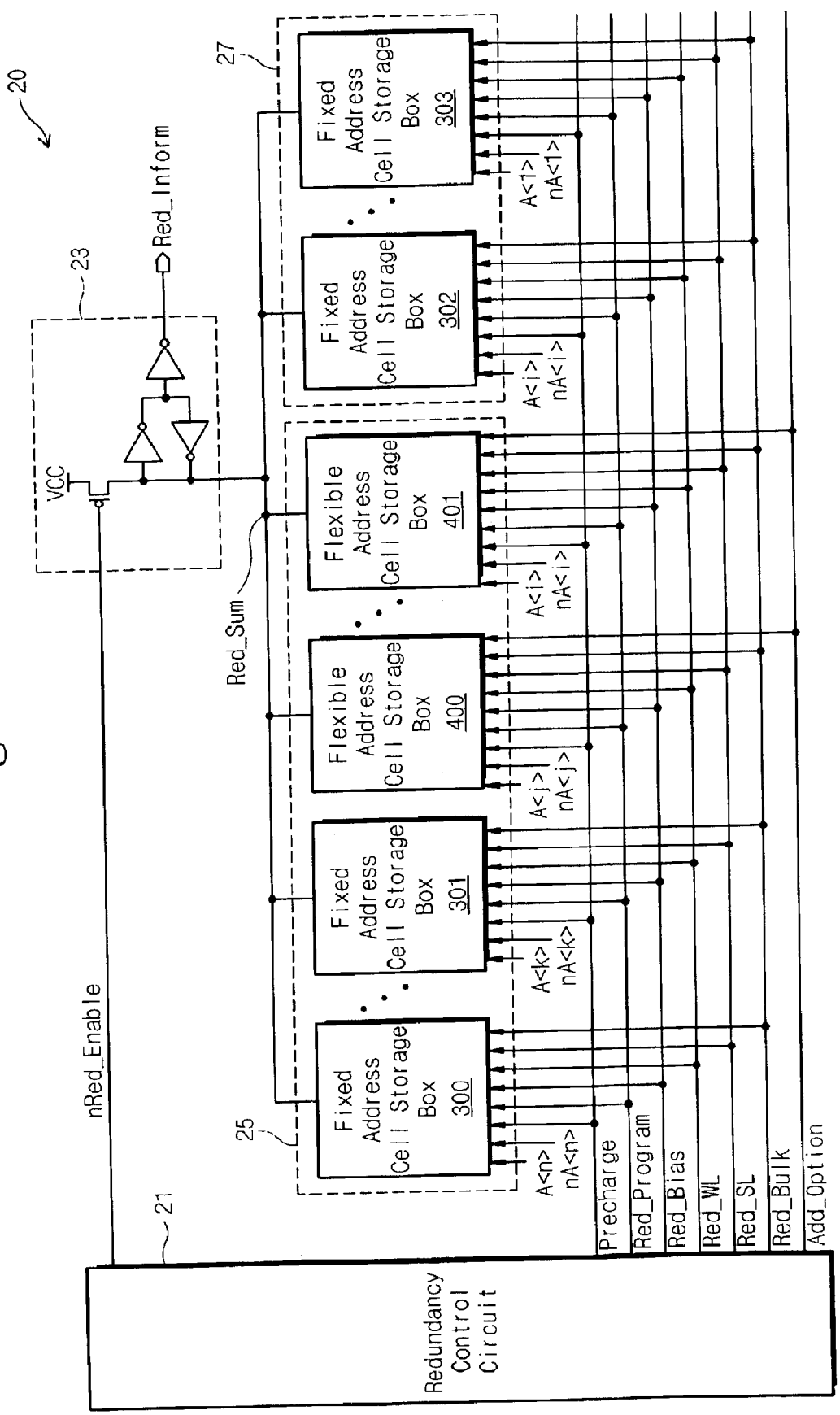
FIG. 2 illustrates a redundancy circuit according to an embodiment of the invention.

A redundancy circuit according to an embodiment of the invention is illustrated in FIG. 2. Referring to FIG. 2, a redundancy circuit 20 includes a redundancy control circuit 21, a redundancy signal generator 23, a sector selector 25 and a bit line selector 27. The redundancy control circuit 21 generates a redundancy enable signal nRed_Enable, a precharge signal Precharge, a redundancy program signal Red_Program, a redundancy bias signal Red_Bias, a redundancy word line signal Red_WL, a redundancy source signal Red_SL, a redundancy bulk signal Red_Bulk, and a redundancy option signal Add_Option.

Figure 3:
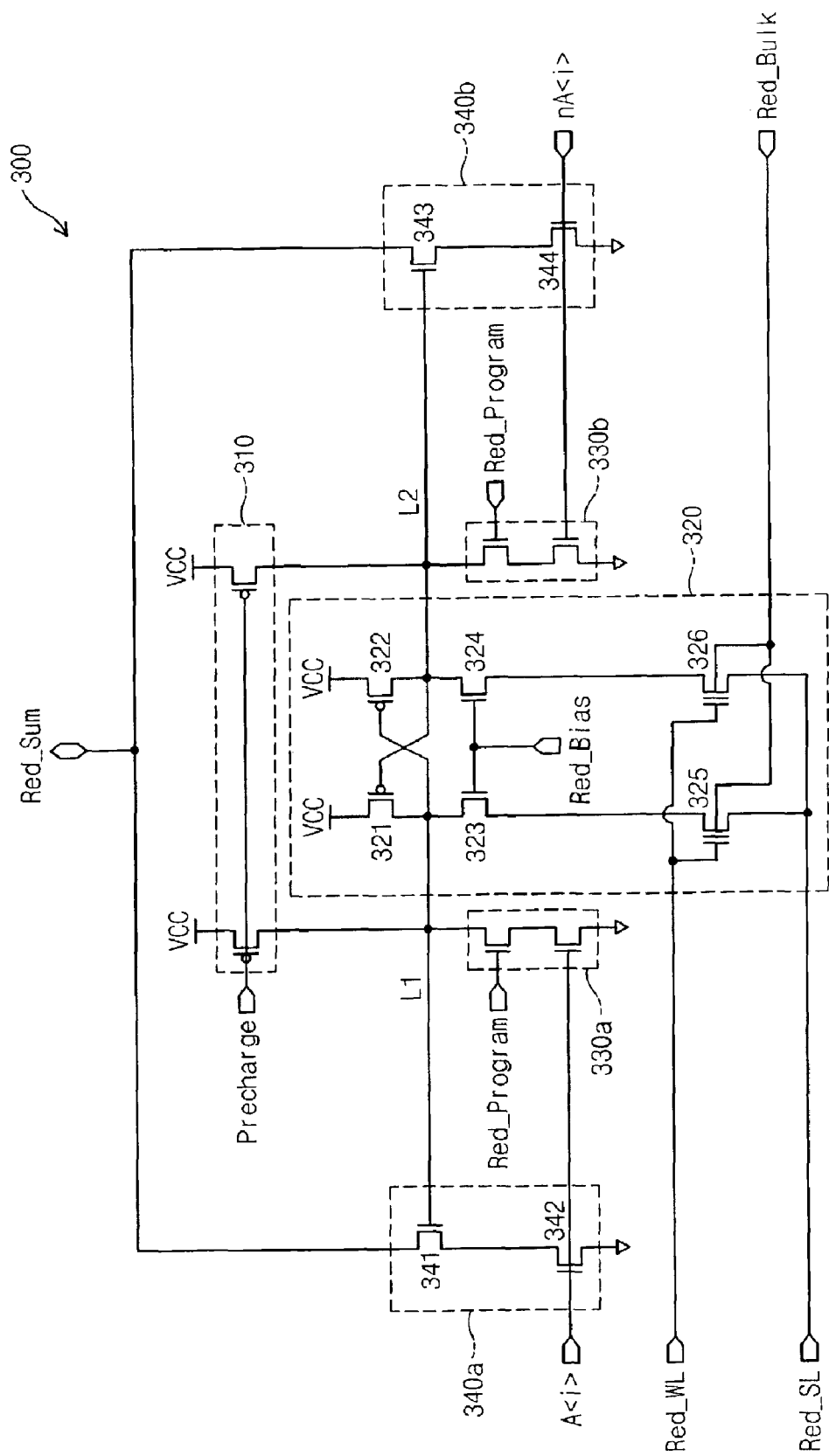
FIG. 3 illustrates the fixed address cell storage box of FIG. 2.

FIG. 3 illustrates the fixed address cell storage box 300 of FIG. 2. This fixed address cell storage block has the same structure as the other fixed address cell storage boxes 301, 302, and 303 of FIG. 2. With reference to FIGS. 2 and 3, the redundancy enable signal nRed_Enable activates the redundancy circuit 20. The precharge signal Precharge precharges a redundancy determination signal Red_Sum up to a power supply voltage VCC, that is, a high level. The redundancy program signal Red_Program is a signal that starts the programming of the coding unit 320. The redundancy bias signal Red_Bias is a signal applied when the coding unit 320 is programmed or read. The redundancy word line signal Red_WL is a signal for driving the word lines of the EPROM memory cells 325 and 326 in the coding unit 320. The redundancy source signal Red_SL is a signal applied to the sources of the EPROM memory cells 325 and 326. The redundancy bulk signal Red_Bulk is a signal applied to the bulk of the EPROM memory cells 325 and 326. The redundancy option signal Add_Option is a signal used to determine whether a defective cell, a defective bit line, or a defective global bit line will be repaired. In this embodiment, choosing the defective cell also selects the defective bit line since the defective cell is repaired in the same manner as the defective bit line.

The redundancy signal generator 23 is activated in response to the redundancy enable signal nRed_Enable and generates a redundancy signal Red_Inform in response to the redundancy determination signal Red_Sum outputted from the sector selector 25 or the bit line selector 27. The sector selector 25 and bit line selector 27 will be described in greater detail below. The redundancy determination signal Red_Sum is initially precharged to the power supply voltage at a high level in response to the redundancy enable signal nRed_Enable. If the redundancy determination signal Red_Sum outputted from the sector selector 25 or the bit line selector 27 is at a high level, the redundancy signal Red_Inform is at a high level as well. This means that a repair operation using the redundancy memory block is not required. When the redundancy determination signal Red_Sum is at a low level, the defective bit line or the defective global bit line is replaced with the redundancy memory block.

The sector selector 25 includes fixed address cell storage boxes 300, 301 and flexible address cell storage boxes 400, 401. The bit line selector 27 includes fixed address cell storage boxes 302, 303. The fixed address cell storage boxes 300, 301 store the addresses of the defective bit lines. The flexible address cell storage boxes 400, 401 selectively store the addresses of the defective global bit lines.

Referring to FIG. 3, the fixed address cell storage box 300 includes a precharging unit 310, a coding unit 320, two programming units 330a and 330b, and two selecting units 340a and 340b. The precharging unit 310 precharges a first node L1 and a second node L2 up to the power supply voltage VCC in response to the precharge signal Precharge being at a low level.

The coding unit 320 has a first transistor 321 whose gate and source is connected to the source and gate, respectively, of a second transistor 322, a third transistor 323, a fourth transistor 324 connected to the redundancy bias signal Red_Bias, and programmable EPROM memory cells 325 and 326. The programming units 330a, 330b program the EPROM memory cells 325, 326 in response to address signals A<i>, nA<i> of the defective bit lines and the redundancy program signal Red_Program. The selecting units 340a, 340b generate the redundancy determination signal Red_Sum in response to the address signals A<i>, nA<i> of the defective bit lines and the levels of the first node L1 and the second node L2. The redundancy determination signal Red_Sum is used by the redundancy signal generator 23 to generate the redundancy signal Red_Inform.

The EPROM memory cells 325 and 326 are programmed by address information on the defective bit lines as follows. Suppose, for example, that a first EPROM memory cell 325 will be programmed. Initially, the first and second nodes L1 and L2 are precharged up to the power supply voltage VCC by the precharging unit 310. A high voltage (e.g., about 10 V) at which the EPROM memory cells can be programmed is applied to the redundancy word lines Red_WL. The ground voltage GND is applied to the redundancy source signal Red_SL. The power supply voltage VCC is applied to the redundancy programming signal Red_Program. A voltage level (VCC+Vt) that is higher than the power supply voltage VCC by a threshold voltage Vt of a transistor is applied to the redundancy bias signal Red_Bias. The ground voltage GND is applied to the address signal A<i> and the voltage power supply voltage VCC is applied to the complementary address signal nA<i>. Therefore, the first node L1 and the second node L2 are set to the power supply voltage VCC and the ground voltage GND, respectively. If this condition is maintained for a sufficient predetermined time, the first EPROM memory cell 325 is programmed and the second EPROM memory cell 326 is inhibited from being programmed. Accordingly, the first and second EPROM memory cells 325 and 326 are complementary to each other and are programmed according to the address signals A<i> and nA<i>.

Figure 1:
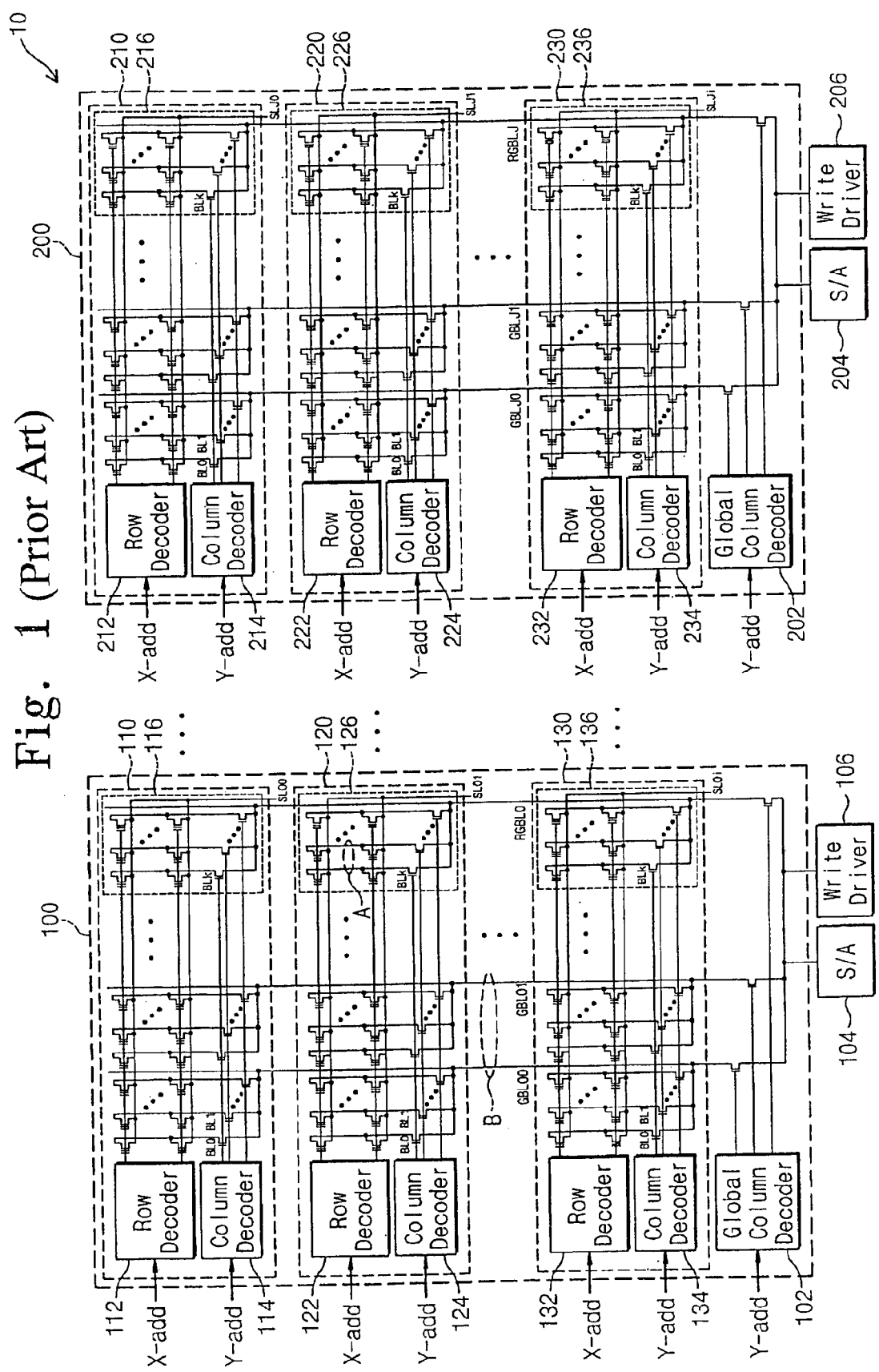
FIG. 1 illustrates a memory array block of a general nonvolatile memory device.

Then, if predetermined address signals A<i>, nA<i> are applied to the fixed address cell storage box 300, the selecting units 340a, 340b generate the redundancy determination signal Red_Sum in response to the address signals A<i>, nA<i> and the level of the first and second nodes L1 and L2. The address signal A<i> of the defective bit line is applied at a high level while the first EPROM memory cell 325 is programmed and the second EPROM memory cell 326 is inhibited from being programmed. The transistors 341 and 342 are turned on and the redundancy determination signal Red_Sum is set to a low level in response to the address signal A<i> at the high level and the level of the first node L1. A low level redundancy determination signal Red_Sum generates a low level redundancy signal Red_Inform in the redundancy signal generator 23 shown in FIG. 2. The low level redundancy signal Red_Inform allows the defective bit line to be replaced with a predetermined bit line contained in the redundancy memory blocks 116, 126, 136, 216, 226, and 236 of FIG. 1.

Figure 4:
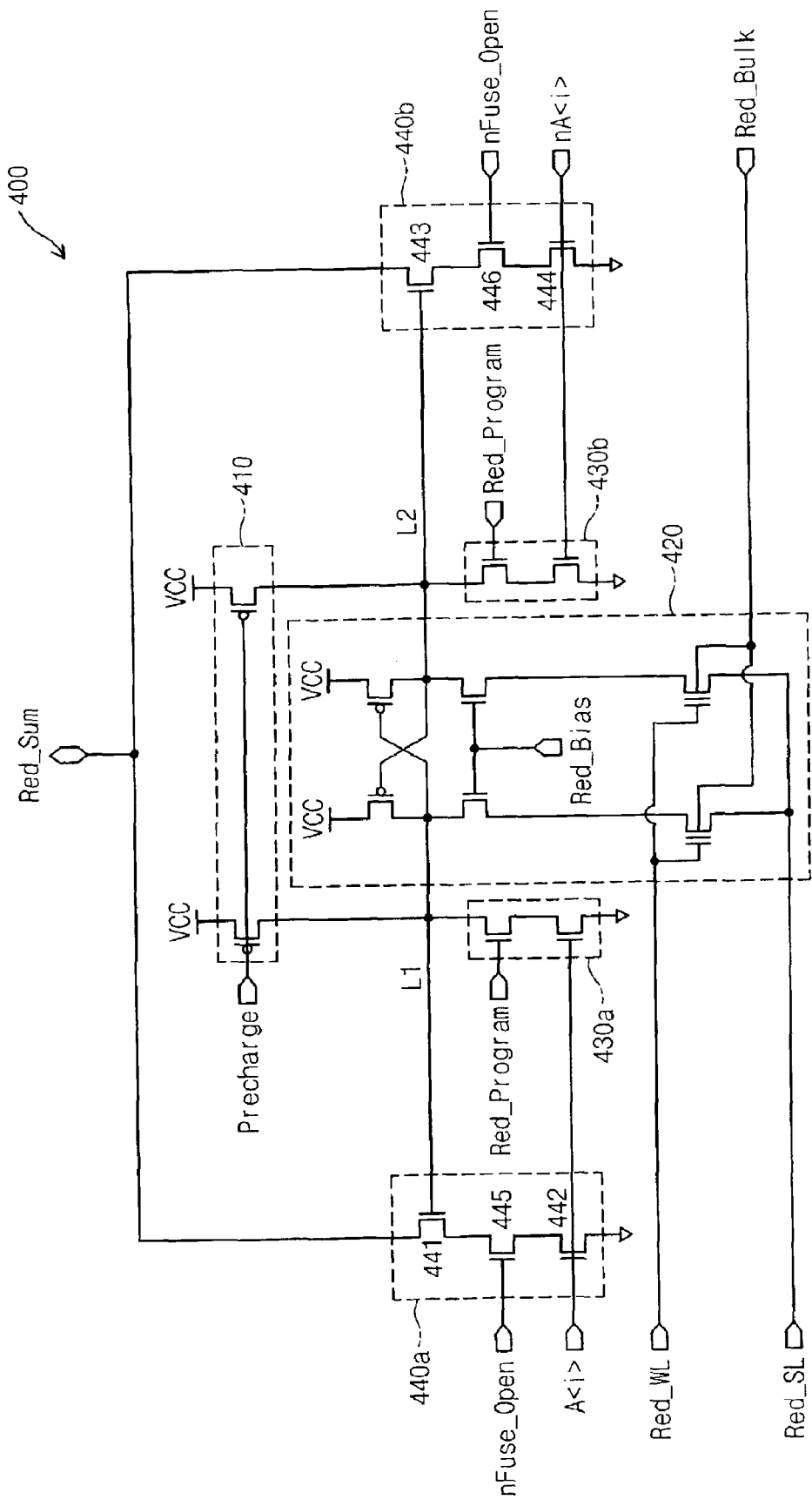
FIG. 4 illustrates the flexible address cell storage box of FIG. 2.

FIG. 4 is a circuit diagram of the flexible address cell storage box 400 of FIG. 2. The flexible address cell storage box 401 of FIG. 2 has the same structure. Referring to FIG. 4, the flexible address cell storage box 400 includes a precharging unit 410, a coding unit 420, two programming units 430a, 430b and two selecting unit 440a, 440b. The flexible address cell storage box 400 is different from the fixed address cell storage box 300 shown in FIG. 3 in that the flexible address cell storage box 400 further includes transistors 445 and 446 responsive to a fuse open signal nFuse_Open applied to the selecting units 440*a*, 440*b*. The address signals A<i>, nA<i> that are applied to the flexible address cell storage box 400 are addresses of defective global bit lines while the address signals A<i>, nA<i> that are applied to the fixed address cell storage box 300 are addresses of defective bit lines. The units 410, 420, and 430*a*, 430*b* shown in FIG. 4 are similar to the units 310, 320 and 330*a*, 330*b* of FIG. 3 and therefore their detailed descriptions will be omitted.

The selecting units 440*a*, 440*b* generate the redundancy determination signal Red_Sum in response to the voltage levels of the first and second nodes L1 and L2, the sector address signals A<i>, nA<i> that are addresses of the defective global bit line, and the fuse open signal nFuse_Open. The fuse open signal nFuse_Open is used to enable operation of the flexible address cell storage box 400 or to prevent its operation. If the fuse open signal nFuse_Open is at a high level, the flexible address cell storage box 400 is operated like the fixed address cell storage box 300 of FIG. 3. In other words, the flexible address cell storage box 400 programs and reads first and second EPROM memory cells of the coding unit 420 according to the sector address signals A<i>, nA<i>. Consequently, the redundancy determination signal Red_Sum and the redundancy signal Red_Inform are respectively set to low levels, so that the defective global bit lines are replaced by the global bit lines contained in the redundancy memory blocks 116, 126, 136, 216, 226, and 236 of FIG. 1.

If the fuse open signal nFuse_Open is at a low level, the transistors 445 and 446 of the selecting units 440*a*, 440*b* are turned off and the path to the ground voltage GND is cut off. Accordingly, the flexible address cell storage box 400 is inoperational regardless of the sector address signals A<i>, nA<i> applied to the flexible address cell storage box 400. The redundancy determination signal Red_Sum maintains the high level initially set by the redundancy signal generator 23. This implies that there is no defective global bit line.

Returning to FIG. 2, the sector selector 25 repairs the defective bit lines through the fixed address cell storage boxes 300, 301 and repairs the defective global bit lines through the flexible address cell storage boxes 400, 401. The bit line selector 27 includes the fixed address cell storage boxes 302, 303. The fixed address cell storage boxes 302, 303 are very similar to the fixed address cell storage boxes 300, 301. In other words, the fixed address cell storage boxes 302, 303 program and read EPROM memory cells according to the defective bit line address signals A<i>, nA<i> and also repair the defective bit lines.

Accordingly, the redundancy circuit 20 is provided with the sector selector 25 for repairing the defective global bit lines and the bit line selector 27 for repairing the defective bit lines. Compared with conventional redundancy circuits that contain fuses to repair the defective bit lines and the defective global lines and that correspond to the bit line addresses and the sector addresses, the redundancy circuit 20 has a smaller area since it does not contain a coding unit corresponding to a sector address of the bit line selector 27. The flexible address cell storage boxes 400, 401 of the sector selector 25 are selectively inhibited from being operated, so that the sector selector 25 repairs the defective bit lines in a manner similar to the bit line selector 27. Consequently, embodiments of the invention exhibit an improved repair rate of the defective bit lines.

Figure 5:
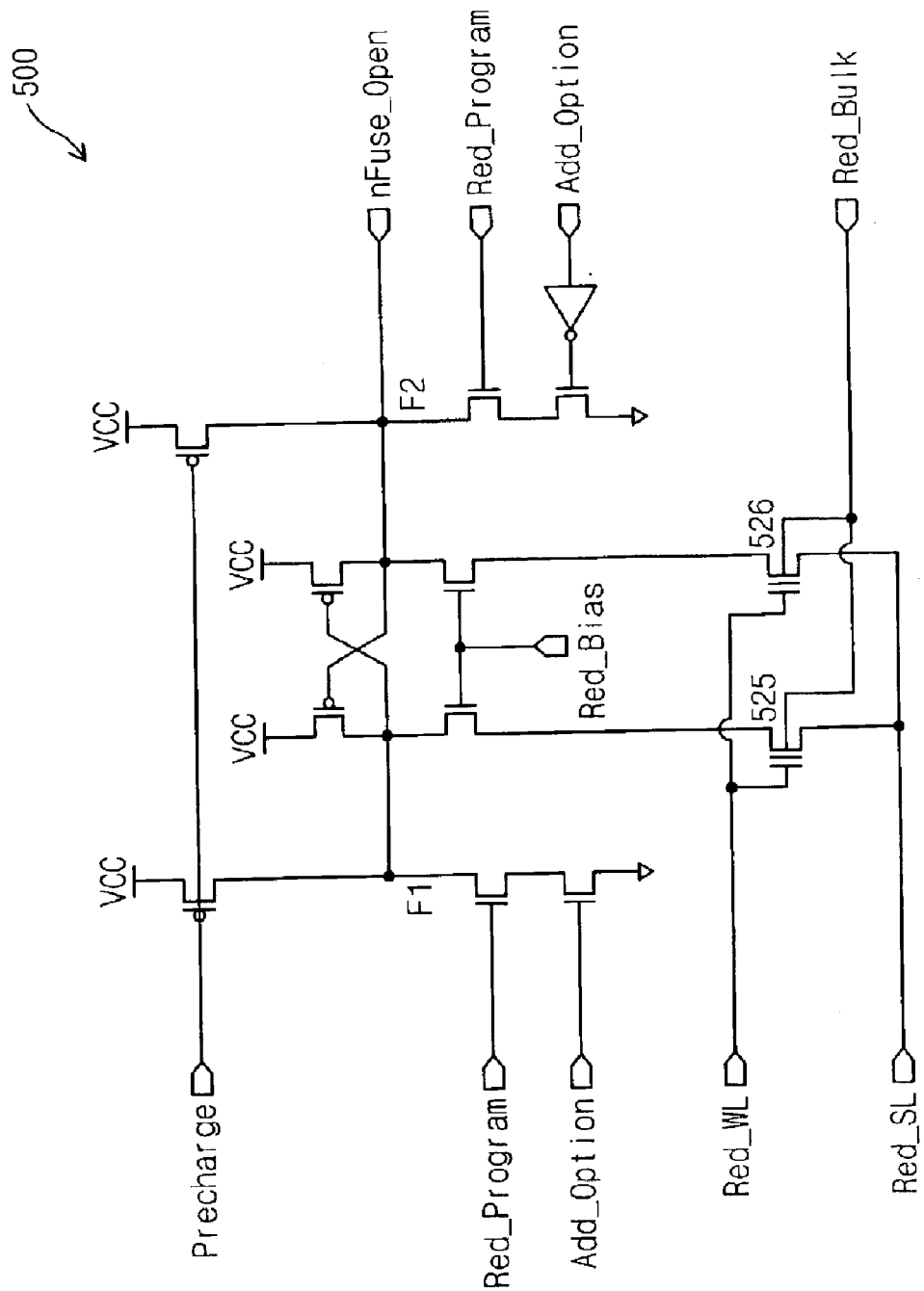
FIG. 5 illustrates a fuse open signal generator that generates the fuse open signal in FIG. 4.

A circuit for generating the fuse open signal nFuse_Open of the redundancy circuit 20 is illustrated in FIG. 5. Referring to FIG. 5, a fuse open signal generator 500 programs the EPROM memory cells 525, 526 in response to the redundancy signal Add_Option and the redundancy program signal Red_Program. Initially, nodes F1, F2 are set to high levels in response to the precharge signal Precharge at a low level. If programming conditions are maintained such that the redundancy program signal Red_Program, the redundancy bias signal Red_Bias, and the redundancy word line signal Red_WL are at high levels and the redundancy source signal Red_SL is at a low level, the second EPROM memory cell 526 is programmed and the first EPROM memory cell 525 is inhibited from being programmed in response to the redundancy option signal Add_Option at a high level.

Conversely, if the redundancy option signal Red_Option is at a low level, the first EPROM memory cell 525 is programmed and the second EPROM memory cell 526 is inhibited from being programmed. Thus, the fuse open signal nFuse_Open is set to a low level at the node F2.

Figure 6:
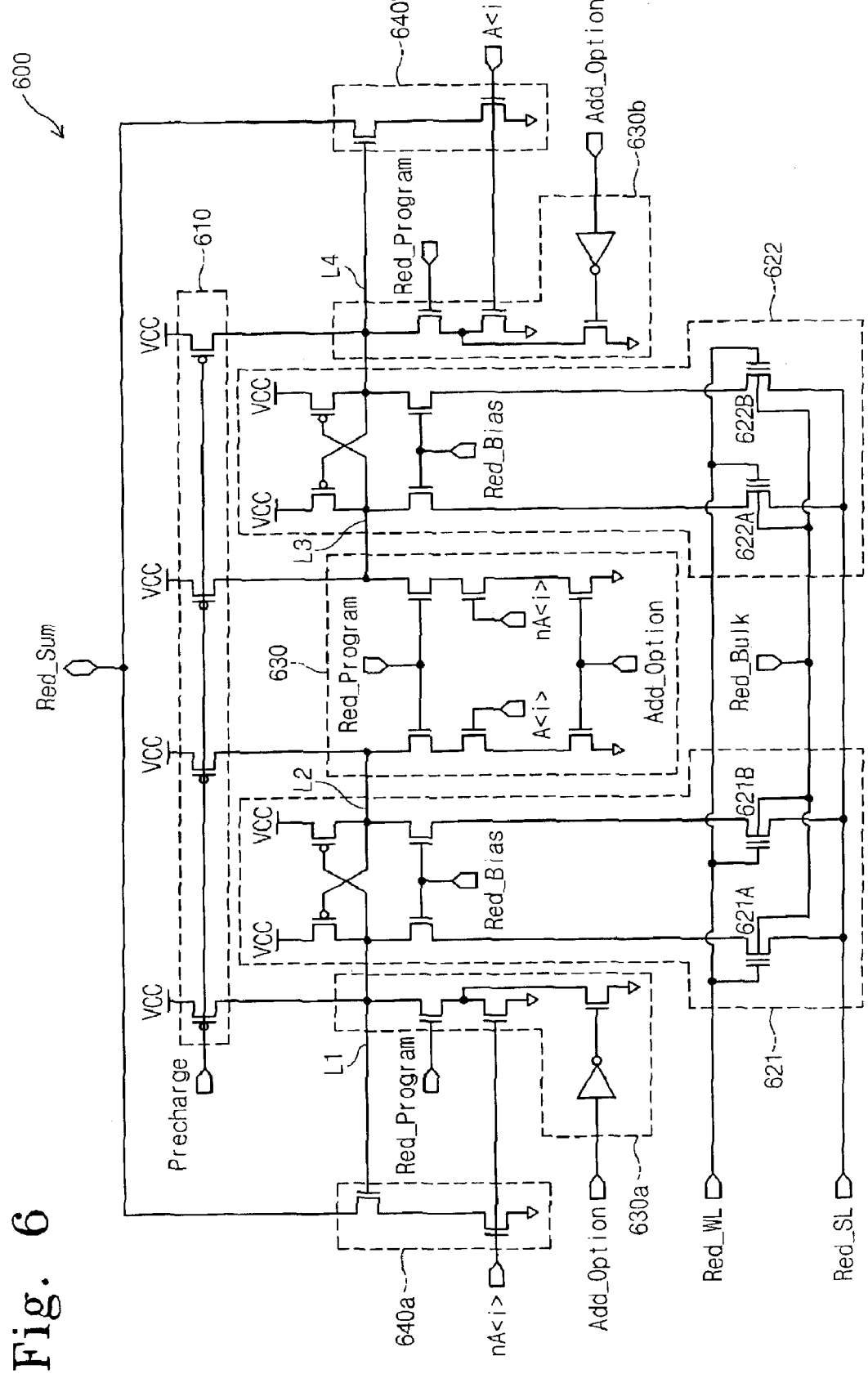
FIG. 6 illustrates a flexible address cell storage box for a redundancy circuit according to another embodiment of the invention.

Another flexible address cell storage box 600 in accordance with another embodiment of the invention is illustrated in FIG. 6. The flexible address cell storage box 600 may replace the flexible address cell storage box 400 or 401 in FIG. 2. The flexible address cell storage box 600 includes a precharging unit 610, a first coding unit 621, a second coding unit 622, two programming units 630*a*, 630*b* and a selecting unit 640*a*, 640*b*. The flexible address cell storage box 600 is different from the flexible address cell storage box 400 shown in FIG. 4 in that address information corresponding to the defective bit lines and the defective global bit lines is programmed in duplicate. While the flexible address cell storage box 400 of FIG. 4 is operated responsively to the fuse open signal nFuse_Open, the flexible address cell storage box 600 is operated responsively to the redundancy option signal Add_option.

The precharging unit 610 precharges first to fourth nodes L1, L2, L3, and L4 in response to the precharge signal Precharge. The first coding unit 621 is connected to the first and second nodes L1 and L2 and programs the first and second EPROM memory cells in response to the addresses A<i>, nA<i> of the defective global bit lines. The second coding unit 622 is connected to the third and fourth nodes L3 and L4 and programs the third and fourth EPROM memory cells in response to of the addresses A<i>, nA<i> of the defective global bit lines. The programming units 630*a*, 630*b* program the first coding unit 621 and the second coding unit 622, respectively, in response to the addresses A<i>, iA<i> of the defective global bit lines, the redundancy program signal Red_Program, and the redundancy option signal Add_option. Two selecting units 640*a*, 640*b* repair the defective global bit lines in response to a level of the first node L1, a level of the fourth node L4, and the addresses A<i>, nA<l> of the defective global bit lines.

Hereinafter, the programming operation of the first and second coding units 621, 622 will be described. If the first and fourth EPROM memory cells 621A and 622B are programmed according to the addresses of the defective global bit line (i.e., the sector addresses A<i>, nA<i>), the second and third EPROM memory cells 621B and 622A are inhibited from being programmed. Conversely, the first and fourth EPROM memory cells 621A and 622B are inhibited from being programmed when the second and third EPROM memory cells 621B and 622A are programmed.

On the other hand, the programming units 630*a*, 630*b* program or read the first coding unit 621 and second coding unit 622, respectively, according to the addresses A<i>, nA<i> of the defective global bit line in response to the redundancy program signal Red_Program at a high level when the redundancy option signal Add_Option is at a high level. Thus, the redundancy determination signal Red_Sum is generated in response to the levels of the first and fourth nodes L1 and L4 and then the defective global bit line is repaired. However, if the redundancy option signal Add_Option is at a low level, the first and fourth nodes L1 and L4 are set to low levels in response to the redundancy program signal Red_Program. The selecting units 640a, 640b are prevented from operating so the flexible address cell storage box 600 does not operate either. This implies that the defective global bit line is not repaired. Thus, the flexible address cell storage box 600 of the present invention determines whether or not the defective global bit line is repaired in response to the redundancy option signal Red_Option.

Returning to FIG. 2, the sector selector 25 including the flexible address cell storage box 600 determines to repair the defective bit lines only through the fixed address cell storage boxes 300, 301 or to repair even the defective global bit lines through the flexible address cell storage boxes 600, 601 in response to the redundancy option signal Add_Option. Therefore, the sector selector 25 selectively inhibits the flexible address cell storage boxes 600, 601 from being operated so as to repair the defective bit lines in a manner similar to the bit line selector 27. Consequently, the repair rate of the defective bit line is improved.

Specific embodiments of the invention as described above will now be briefly summarized.

According to an embodiment of the invention, a semiconductor memory device includes a plurality of sectors, each arranged in a memory cell array form. The sectors include a plurality of memory blocks and a redundancy block. Each of the memory blocks consists of a plurality of memory cells. Data from the selected memory cells are inputted and outputted through bit lines of the memory block and global bit lines of the sector. A redundancy circuit is embedded in the semiconductor memory device. The redundancy circuit includes a sector selector, a bit line selector and a redundancy signal generator. The sector selector saves defective global bit lines and selectively generates redundancy determination signals to save defective global bit lines. The bit line selector generates redundancy determination signals to save defective memory cells and defective bit lines. A redundancy signal generator generates a redundancy signal to substitute the redundancy block for the defective memory cells, the defective bit lines, and the defective global bit lines in response to the redundancy determination signals.

According to this embodiment of the invention, the sector selector includes a fixed address cell storage box for storing addresses of the defective bit lines and a flexible address cell storage box for storing addresses of the defective global bit lines. The fixed address cell storage box includes a precharging unit, a coding unit, programming units, and selecting units. The precharging unit precharges a first node and a second node in response to a precharge signal. The coding unit has programmable memory cells therein and programs the programmable memory cells in response to an address of the defective bit line. The programming units program the coding unit in response to the address of the defective bit line and starts programming the coding unit in response to a redundancy program signal. The selecting units generate the redundancy determination signal in response to the address of the defective bit line, a level of the first node, and a level of the second node.

The coding unit contains programmable memory cells and programs the programmable memory cells according to the address of the defective bit line. The coding unit includes a first EPROM memory cell that is programmed according to the address of the defective bit line and a second EPROM memory cell that is inhibited from being programmed according to the address of the defective bit line. The coding unit also includes a first and a second transistor connected between a voltage source and the first and second nodes, where the gate and source of the first transistor is connected to the source and gate, respectively, of the second transistor. The coding unit further includes a third and a fourth transistor connected between the first and second EPROM memory cells and the first and second nodes, respectively, that programs or reads the coding unit in response to a redundancy bias signal.

The flexible address cell storage box includes a precharging unit, a coding unit, programming units, and selecting units. The precharging unit precharges a first node and a second node in response to a precharge signal. The coding unit contains programmable memory cells and programs the programmable memory cells in response to an address of the defective global bit line. The programming units program the coding unit in response to an address of the defective global bit line and a redundancy program signal that indicates when to start programming the coding unit. The selecting units generate the redundancy determination signal in response to a level of the first node, a level of the second node, the address of the defective global bit line, and a fuse open signal that determines the mode of operation of the flexible address cell storage box.

The bit line selector includes a precharging unit, a coding unit, programming units, and selecting units. The precharging unit precharges a first node and a second node in response to a precharge signal. The coding unit contains programmable memory cells and programs the programmable memory cells in response to an address of the defective bit line. The programming units program the coding unit in response to the address of the defective bit line and a redundancy program signal that indicates when to start programming the coding unit. The selecting units generate the redundancy determination signal in response to the address of the defective bit line, a level of the first node, and a level of the second node. The redundancy circuit further includes a fuse open signal generator for generating a fuse open signal in response to a redundancy option signal and a redundancy program signal. The fuse open signal determines which is saved among the defective bit line and the defective global bit line.

In another embodiment of the invention, a redundancy circuit includes a fixed address cell storage box for storing addresses of the defective bit lines in order to save the defective memory cells and the defective bit lines and a flexible address cell storage box for storing addresses of the defective global bit lines to save selectively the defective global bit lines.

The flexible address cell storage box includes a precharging unit, a first coding unit, a second coding unit, programming units, and selecting units. The precharging unit precharges a first, second, third, and fourth nodes in response to a precharge signal. The first coding unit contains programmable memory cells, is connected to the first node and the second node, and programs the programmable memory cells in response to an address of the defective global bit line. The second coding unit contains programmable memory cells, is connected to the third node and the fourth node, and programs the programmable memory cells in response to an address of the defective global bit line. The programming units program the first coding unit and the second coding unit in response to the address of the defective global bit line, generates a redundancy program signal that initiates programming of the first coding unit and the second coding unit, and generates a redundancy option signal that determines which is saved among the defective bit line and the defective global bit line. The selecting units substitute the redundancy blocks for the defective memory cells, the defective bit lines and the defective global bit lines in response to the level of the first node, the level of the fourth node, and the address of the defective global bit line.

According to embodiments of the invention, the circuit area can be minimized since the coding unit corresponding to the sector address is not included in the bit line selector. The saving rate of the defective bit lines is improved since the sector selector saves the defective bit lines like the bit line selector by selectively inhibiting the flexible address cell storage box from operating.

It will be apparent to those skilled in the art that various modifications and variations can be made to the embodiments described above. Thus, it is intended that the invention cover all possible embodiments provided that they fall within the scope of the appended claims and their equivalents.

What is claimed is:

1. A redundancy circuit configured for use in a semiconductor memory device, wherein the semiconductor memory device comprises a plurality of sectors having a plurality of memory blocks and a plurality of redundancy blocks, each memory block having a plurality of memory cells with data of a selected memory cell input and output through a bit line of the memory block and a global bit line of a corresponding sector, the redundancy circuit comprising:
   a sector selector configured to generate a first redundancy determination signal initiating the repair of defective global bit lines; and
   a bit line selector configured to generate a second redundancy determination signal initiating the repair of defective memory cells and the repair of defective bit lines.

2. The redundancy circuit of claim 1, further comprising:
   a redundancy signal generator configured to generate a redundancy signal in response to the first and second redundancy determination signal, wherein the redundancy signal selectively controls substitution of the plurality of redundancy blocks for a defective memory cell, a defective bit line, and a defective global bit line.

3. The redundancy circuit of claim 1, wherein the sector selector comprises:
   a fixed address cell storage box that stores an address of the defective bit line and a flexible address cell storage box that stores an address of the defective global bit line.

4. The redundancy circuit of claim 3, wherein the fixed address cell storage box comprises:
   a precharging unit configured to precharge a first node and a second node in response to a precharge signal;
   a coding unit having programmable memory cells therein, configured to program the programmable memory cells in response to the address of the defective bit line;
   a programming unit configured to program the coding unit in response to the address of the defective bit line and a redundancy program signal; and
   a selecting unit configured to generate the second redundancy determination signal in response to the address of the defective bit line, a voltage level of the first node and a voltage level of the second node.

5. The redundancy circuit of claim 4, wherein the coding unit comprises:
   a first EPROM memory cell programmed according to the address of the defective bit line;
   a second EPROM memory cell inhibited from being programmed according to the address of the defective bit line;
   a first transistor connected between a power supply voltage and the first node and a second transistor connected between the power supply voltage and the second node, wherein a gate of the first transistor is coupled to a source of the second transistor and wherein a gate of the second transistor is coupled to a source of the first transistor;
   a third transistor responsive to a redundancy bias signal and connected between the first EPROM memory cell and the first node, wherein the redundancy bias signal selects between a program operation and a read operation for the coding unit; and
   a fourth transistor responsive to the redundancy bias signal and connected between the second EPROM memory cell and the second node.

6. The redundancy circuit of claim 3, wherein the flexible address cell storage box comprises:
   a precharging unit configured to precharge a first node and a second node in response to a precharge signal;
   a coding unit having programmable memory cells therein, configured to program the programmable memory cells in response to the address of the defective global bit line;
   a programming unit configured to program the coding unit in response to the address of the defective global bit line and a redundancy program signal; and
   a selecting unit configured to generate the redundancy determination signal in response to the address of the defective global bit line, a voltage level of the first node, and a voltage level of the second node.

7. The redundancy circuit of claim 6, wherein the coding unit comprises:
   a first EPROM memory cell configured to be programmed according to the address of the defective global bit line;
   a second EPROM memory cell configured to be inhibited from being programmed according to the address of the defective global bit line;
   a first transistor connected between a power supply voltage and the first node and a second transistor connected between the power supply voltage and the second node, wherein a gate of the first transistor is coupled to a source of the second transistor and a gate of the second transistor is coupled to a source of the first transistor; and
   a third transistor responsive to a redundancy bias signal and connected between the first EPROM memory cell and the first node, wherein the redundancy bias signal selects between a program operation and read operation for the coding unit; and
   a fourth transistor responsive to the redundancy bias signal connected between the second EPROM memory cell and the second node.

8. The redundancy circuit of claim 6, further comprising:
   a fuse open signal generator configured to generate a fuse open signal in response to a redundancy option signal and the redundancy program signal, wherein the fuse open signal determines whether the defective bit line or the defective global bit line are repaired.

9. The redundancy circuit of claim 8, wherein the fuse open signal generator comprises:
   a precharging unit configured to precharge a third node and a fourth node in response to a precharge signal;
   a third EPROM memory cell configured to be inhibited from being programmed according to the redundancy option signal;
   a fourth EPROM memory cell configured to be programmed according to the redundancy option signal;
   a fifth transistor connected between a power supply voltage and the third node and a sixth transistor connected between the power supply voltage and the fourth node, wherein a gate of the fifth transistor is coupled to a source of the sixth transistor and a gate of the sixth transistor is coupled to a source of the fifth transistor;
   a seventh transistor connected between the third EPROM memory cell and the third node and an eighth transistor connected between the fourth EPROM memory cell and the fourth node, wherein the seventh and eighth transistors are responsive to a redundancy bias signal; and
   a programming unit configured to program the third and the fourth EPROM memory cells in response to the redundancy option signal and the redundancy program signal.

10. The redundancy circuit of claim 1, wherein the bit line selector comprises:
   a precharging unit configured to precharge a first node and a second node in response to a precharge signal;
   a coding unit having programmable memory cells therein, configured to program the programmable memory cells in response to an address of the defective bit line;
   a programming unit configured to program the coding unit in response to the address of the defective bit line and a redundancy program signal; and
   a selecting unit configured to generate the redundancy determination signal in response to the address of the defective bit line, a voltage level of the first node, and a voltage level of the second node.

11. The redundancy circuit of claim 10, wherein the coding unit comprises:
   a first EPROM memory cell configured to be programmed according to the address of the defective bit line;
   a second EPROM memory cell configured to be inhibited from being programmed according to the address of the defective bit line;
   a first transistor connected between a voltage source and the first node and a second transistor connected between the voltage source and the second node, wherein a gate of the first transistor is coupled to a source of the second transistor and a gate of the second transistor is coupled to a source of the first transistor;
   a third transistor responsive to a redundancy bias signal and connected between the first EPROM memory cell and the first node, wherein the redundancy bias signal selects between a program operation and a read operation for the coding unit; and
   a fourth transistor responsive to the redundancy bias signal and connected between the second EPROM memory cell and the second node.

12. A circuit configured for use in a semiconductor memory device, wherein the semiconductor memory device comprises a plurality of sectors with a plurality of memory blocks and a plurality of redundancy blocks, each memory block having a plurality of memory cells with data of a selected memory cell input and output through a bit line of the memory block and a global bit line of a corresponding sector:
   wherein the circuit selectively repairs a defective memory cell, a defective bit line, and a defective global bit line and comprises:
   a fixed address cell storage box configured to store an address of the defective bit line in order to repair the defective memory cell and the defective bit line; and
   a flexible address cell storage box configured to store an address of the defective global bit line in order to repair the defective global bit line.

13. The circuit of claim 12, wherein the flexible address cell storage box comprises:
   a precharging unit configured to precharge a first node and a second node in response to a precharge signal;
   a coding unit having programmable memory cells therein, configured to program the programmable memory cells in response to the address of the defective global bit line;
   a programming unit configured to program the coding unit in response to the address of the defective global bit line and in response to a redundancy program signal; and
   a selecting unit configured to generate the redundancy determination signal in response to a voltage level of the first node, a voltage level of the second node, the address of the defective global bit line, and a fuse open signal that determines the operation of the flexible address cell storage box.

14. The circuit of claim 13, wherein the coding unit comprises:
   a first EPROM memory cell configured to be programmed according to the address of the defective global bit line;
   a second EPROM memory cell configured to be inhibited from being programmed according to the address of the defective global bit line;
   a first transistor connected between a voltage source and the first node and a second transistor connected between the voltage source and the second node, wherein a gate of the first transistor is coupled to a source of the second transistor and a gate of the second transistor is coupled to a source of the first transistor;
   a third transistor responsive to a redundancy bias signal and connected between the first EPROM memory cell and the first node, wherein the redundancy bias signal selects between a program operation and a read operation for the coding unit; and
   a fourth transistor responsive to the redundancy bias signal and connected between the second EPROM memory cell and the second node.

15. The redundancy circuit of claim 12, wherein the flexible address cell storage box comprises:
   a precharging unit configured to precharge a first node, a second node, a third node, and a fourth node in response to a precharge signal;
   a first coding unit with programmable memory cells therein, connected to the first node and the second node, wherein the first coding unit is configured to program the programmable memory cells in response to the address of the defective global bit line;
   a second coding unit with programmable memory cells therein, connected to the third node and the fourth node, wherein the second coding unit is configured to program the programmable memory cells in response to the address of the defective global bit line;

a programming unit configured to program the first coding unit and the second coding unit in response to the address of the defective global bit line, a redundancy program signal, and a redundancy option signal, wherein the redundancy program signal starts programming of the first and second coding units and the redundancy option signal determines whether the defective bit line or the defective global bit line is repaired; and a selecting unit configured to substitute one of the plurality of redundancy blocks for one of the defective memory cell, the defective bit line, and the defective global bit line in response to a voltage level of the first node, a voltage level of the fourth node, and the address of the defective global bit line.

16. The redundancy circuit of claim 15, wherein the first coding unit comprises:

a first EPROM memory cell configured to be programmed according to the address of the defective global bit line;

a second EPROM memory cell configured to be inhibited from being programmed according to the address of the defective global bit line;

a first transistor connected between a voltage source and the first node and a second transistor connected between the voltage source and the second node, wherein a gate of the first transistor is coupled to a source of the second transistor and a gate of the second transistor is coupled to source of the first transistor;

a third transistor responsive to a redundancy bias signal and connected between the first EPROM memory cell and the first node, wherein the redundancy bias signal selects between a program operation and read operation for the first coding unit; and a fourth transistor responsive to the redundancy bias signal and connected between the second EPROM memory cell and the second node.

17. The redundancy circuit of claim 15, wherein the second coding unit comprises:

a first EPROM memory cell that is inhibited from being programmed according to the address of the defective global bit line;

a second EPROM memory cell that is programmed according to the address of the defective global bit line;

a first transistor connected between a power supply voltage and the first node and a second transistor connected between the power supply voltage and the second node, wherein a gate of the first transistor is coupled to a source of the second transistor and a gate of the second transistor is coupled to a source of the first transistor;

a third transistor responsive to a redundancy bias signal and connected between the first EPROM memory cell and the first node, wherein the redundancy bias signal selects between a program operation and a read operation for the second coding unit; and a fourth transistor responsive to the redundancy bias signal and connected between the second EPROM memory cell and the second node.

* * * * *

UNITED STATES PATENT AND TRADEMARK OFFICE
CERTIFICATE OF CORRECTION

PATENT NO. : 6,944,085 B2 Page 1 of 1
APPLICATION NO. : 10/376757
DATED : September 13, 2005
INVENTOR(S) : Lee et al.

It is certified that error appears in the above-identified patent and that said Letters Patent is hereby corrected as shown below:

Column 1, line 58, please replace "BL1, of the" with --BL1,...,of the--
Column 6, line 55, please replace "A<1>, nA<1>" with -- A<i>, nA<i>--

Signed and Sealed this

Twenty-first Day of November, 2006

JON W. DUDAS
*Director of the United States Patent and Trademark Office*